(12) United States Patent
Tang et al.

(10) Patent No.: US 11,296,174 B2
(45) Date of Patent: Apr. 5, 2022

(54) METHOD OF MANUFACTURING DISPLAY PANEL AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Jia Tang, Shenzhen (CN); Jangsoon Im, Shenzhen (CN)

(*) Notice: Subject to any disclaimer, the term of this patent is extended or adjusted under 35 U.S.C. 154(b) by 201 days.

(21) Appl. No.: 16/627,364

(22) PCT Filed: Dec. 24, 2019

(86) PCT No.: PCT/CN2019/127959
§ 371 (c)(1),
(2) Date: Dec. 30, 2019

(87) PCT Pub. No.: WO2021/114398
PCT Pub. Date: Jun. 17, 2021

(65) Prior Publication Data
US 2021/0335967 A1    Oct. 28, 2021

(30) Foreign Application Priority Data
Dec. 11, 2019    (CN) .......................... 201911268944.6

(51) Int. Cl.
H01L 27/32    (2006.01)
H01L 51/52    (2006.01)
H01L 51/56    (2006.01)

(52) U.S. Cl.
CPC ...... *H01L 27/3272* (2013.01); *H01L 27/3246* (2013.01); *H01L 27/3262* (2013.01);
(Continued)

(58) Field of Classification Search
CPC ............. H01L 27/3272; H01L 27/3246; H01L 27/3262; H01L 2227/323
(Continued)

(56) References Cited

U.S. PATENT DOCUMENTS

2015/0349138 A1* 12/2015 Sone ........................ C09D 7/61
345/206
2016/0190329 A1* 6/2016 Matsumoto ....... H01L 29/78696
345/55

(Continued)

OTHER PUBLICATIONS

English Machine Translation of CN 110444567 (Year: 2019).*
English Machine Translation of CN 108878689 (Year: 2018).*

*Primary Examiner* — Dzung Tran

(57) ABSTRACT

A method of manufacturing a display panel and the display panel are provided. The method of manufacturing the display panel includes providing a substrate; depositing a transparent electrode layer and a first metal layer on the substrate, and etching the transparent electrode layer and the first metal layer to form a light-shielding layer and an anode; forming a buffer layer, an oxide layer, and an insulating layer on the light-shielding layer in sequentially, and the buffer layer and the insulating layer are formed by a same photomask; depositing a second metal layer on the insulating layer and etching the second metal layer to form a source, a gate, and a drain; and forming a pixel defining layer, a light-emitting layer, and a cathode layer on the second metal layer in sequentially.

9 Claims, 5 Drawing Sheets

(52) U.S. Cl.
CPC .......... *H01L 51/5206* (2013.01); *H01L 51/56* (2013.01); *H01L 2227/323* (2013.01); *H01L 2251/308* (2013.01)

(58) Field of Classification Search
USPC .......................................................... 257/72
See application file for complete search history.

(56) References Cited

U.S. PATENT DOCUMENTS

| | | | |
|---|---|---|---|
| 2017/0012135 A1* | 1/2017 | Tanaka .............. | H01L 29/66969 |
| 2017/0263210 A1* | 9/2017 | Saotome ............. | H01L 27/3258 |
| 2019/0172390 A1* | 6/2019 | Saotome ............. | G09G 3/3225 |

* cited by examiner

METHOD OF MANUFACTURING DISPLAY PANEL AND DISPLAY PANEL

BACKGROUND OF INVENTION

Field of Invention

The present disclosure relates to the field of display panel, and more particularly, to a method of manufacturing a display panel and the display panel.

Description of Prior Art

With development of display technology, active-matrix organic light-emitting diode (AMOLED) is widely used due to its advantages in energy consumption, color saturation, contrast, and flexible application over liquid crystal display (LCD).

In order to reduce parasitic capacitance, thin film transistor structure currently applied to AMOLED driving circuit usually adopts top-gate thin film transistor. However, manufacturing time and cost of the top-gate thin film transistor become longer and higher, respectively, due to its complex structure and greater number of film layers.

The technical problems to be solved include longer manufacturing time and a higher manufacturing cost of current top-gate thin film transistor due to complex structure and more film layers.

SUMMARY OF INVENTION

The present disclosure provides a method of manufacturing a display panel and the display panel, as such it may efficiently save manufacturing cost.

In one aspect, one embodiment of the present disclosure provides a method of manufacturing a display panel, including:

providing a substrate;

depositing a transparent electrode layer and a first metal layer on the substrate, and etching the transparent electrode layer and the first metal layer, to form a light-shielding layer and an anode;

forming a buffer layer, an oxide layer, and an insulating layer on the light-shielding layer in sequentially, and the buffer layer and the insulating layer are formed by the same photomask;

depositing a second metal layer on the insulating layer, and etching the second metal layer, to form a source, a gate, and a drain; and forming a pixel defining layer, a light-emitting layer, and a cathode layer on the second metal layer in sequentially.

In another aspect, one embodiment of the present disclosure provides a display panel, including:

in one embodiment of the method of manufacturing the display panel of the present disclosure, the substrate including a base plate and a color film layer disposed on the base plate.

In one embodiment of the method of manufacturing the display panel of the present disclosure, step of etching the transparent electrode layer and the first metal layer, to form the light-shielding layer and an anode includes:

etching the transparent electrode layer and the first metal layer, to form a first via hole and a second via hole exposing the base plate; in one embodiment, the transparent electrode layer and the first metal layer disposed between the first via hole and the second via hole are the light-shielding layer; and etching the first metal layer to expose the transparent electrode layer disposed on the color film layer; in one embodiment, the transparent electrode layer disposed on the color film layer is the anode.

In one embodiment of the method of manufacturing the display panel of the present disclosure, between the steps of forming the buffer layer, the oxide layer, and the insulating layer on the light-shielding layer in sequentially, and depositing the second metal layer on the insulating layer further includes:

etching the insulating layer, to expose a first portion of the oxide layer and a second portion of the oxide layer; and
conductorizing the first portion and the second portion, to form an active layer.

In one embodiment of the method of manufacturing the display panel of the present disclosure, step of etching the second metal layer, to form the source, the gate, and the drain includes:

etching the second metal layer, to form a third via hole exposing the first portion and a fourth via hole exposing the second portion. In one embodiment, the second metal layer disposed between the third via hole and the fourth via hole is the gate, and the second metal layers disposed on the two lateral sides of the gate are the source and the drain.

In one embodiment of the method of manufacturing the display panel of the present disclosure, further includes:

etching the insulating layer and the buffer layer, to expose the anode.

In one embodiment of the method of manufacturing the display panel of the present disclosure, step of forming the pixel defining layer, the light-emitting layer, and the cathode layer in sequentially includes:

forming the pixel defining layer on the second metal layer, and etching the pixel defining layer, to expose the anode; and
forming the light-emitting layer and the cathode layer on the pixel defining layer in sequentially. In one embodiment, the light-emitting layer is connected to the anode.

In one embodiment of the method of manufacturing the display panel of the present disclosure, a material of the pixel defining layer includes a non-hydrophobic material.

In one embodiment of the method of manufacturing the display panel of the present disclosure, a material of the pixel defining layer includes a hydrophobic material.

In another embodiment, one embodiment of the present disclosure provides a display panel, includes:

a substrate;

a transparent electrode; and the transparent electrode is disposed on the substrate;

a first metal layer, and the first metal layer is disposed on the transparent electrode;

a buffer layer, and the buffer layer is disposed on the first metal layer;

an oxide layer, and the oxide layer is disposed on the buffer layer;

an insulating layer, and the insulating layer is disposed on the oxide layer, and the insulating layer and the buffer layer are formed by the same photomask;

a second metal layer, and the second metal layer is disposed on the insulating layer;

a pixel defining layer, and the pixel defining layer is disposed on the second metal layer;

a light-emitting layer, and the light-emitting layer is disposed on the pixel defining layer; and a cathode layer, and the cathode layer is disposed on the light-emitting layer;

in one embodiment, the transparent electrode and the first metal layer constitute a light-shielding layer; the transparent electrode constitutes an anode; and the second metal layer constitutes a source, a gate, and a drain.

In one embodiment of the display panel of the present disclosure, the substrate includes a base plate and a color film.

In one embodiment of the display panel of the present disclosure, a first via hole and a second via hole are disposed on the first metal layer, allowing the base plate to be exposed.

In one embodiment of the display panel of the present disclosure, the transparent electrode and the first metal layer disposed between the first via hole are the light-shielding layer, and the transparent electrode disposed on the color film is the anode.

In one embodiment of the display panel of the present disclosure, a third via hole and a fourth via hole are disposed on the second metal layer, allowing the oxide layer to be exposed.

In one embodiment of the display panel of the present disclosure, a portion of the second metal layer disposed between the third via hole and the fourth via hole is the gate, and the source and the drain are disposed on two lateral sides of the gate.

In one embodiment of the display panel of the present disclosure, the source and the drain are connected to the active layer through the third via hole and the fourth via hole.

In one embodiment of the display panel of the present disclosure, the anode is connected to the light-emitting layer.

In one embodiment of the display panel of the present disclosure, a material of the pixel defining layer includes a non-hydrophobic material.

In one embodiment of the display panel of the present disclosure, a material of the pixel defining layer com includes a hydrophobic material.

In one embodiment of the display panel of the present disclosure, a material of the transparent electrode includes indium tin oxide or transparent conductive oxide.

The beneficial effects of the present disclosure are that a method of manufacturing a display panel provided by the embodiments of the present disclosure includes providing a substrate; depositing a transparent electrode layer and a first metal layer on the substrate, and etching the transparent electrode layer and the first metal layer to form a light-shielding layer and an anode; forming a buffer layer, an oxide layer, and an insulating layer on the light-shielding layer in sequentially, and the buffer layer and the insulating layer are formed by the same photomask; depositing a second metal layer on the insulating layer and etching the second metal layer to form a source, a gate, and a drain; and forming a pixel defining layer, a light-emitting layer, and a cathode layer on the second metal layer in sequentially. The present disclosure may save manufacturing time and manufacturing cost of the display panel by forming the buffer layer and the insulating layer with the same photomask, forming the source, gate, and the drain at the same time, and forming the light-shielding layer and the anode at the same time.

DETAILED DESCRIPTION OF PREFERRED EMBODIMENTS

The specific structure and detail function disclosed herein are merely represented, and the purpose thereof is used to describe the exemplary embodiment. However, the present disclosure may be implemented through multiple alternative forms, which may not be construed as being limited to the embodiments described herein.

Embodiments of the present disclosure provide a method of manufacturing a display panel and the display panel, and are explained in detail as follows.

Figure 1:
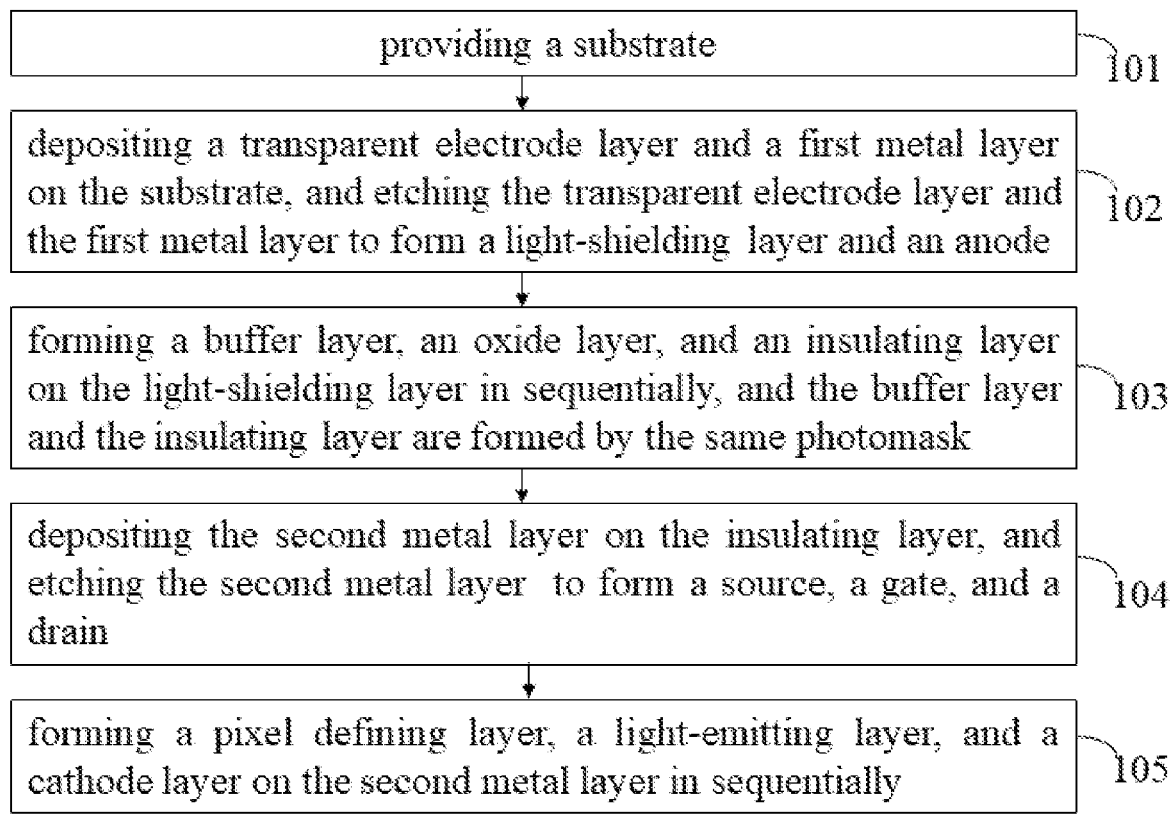
FIG. 1 is a schematic view of a method of manufacturing a display panel according to one embodiment of the present disclosure.
Figure 10:
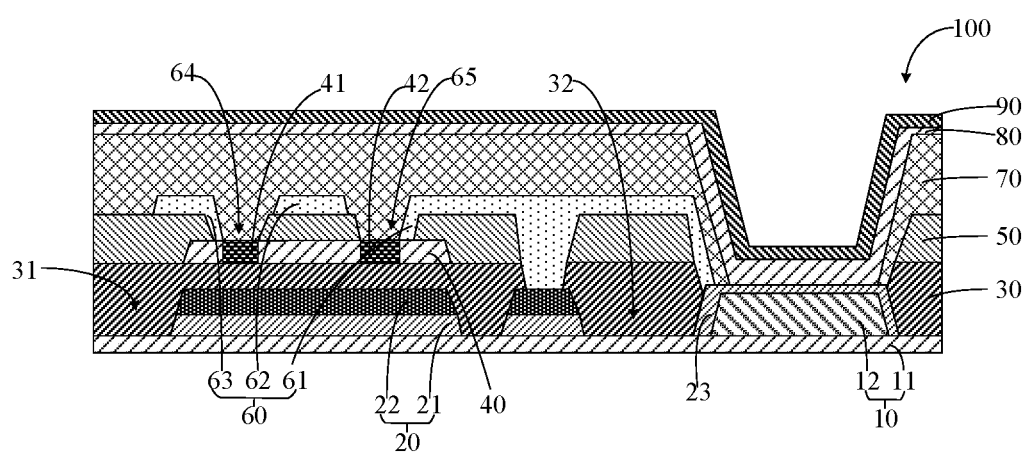
FIG. 10 is a schematic view of the display panel according to the embodiment of the present disclosure.

Referring to FIG. 1, an embodiment of the present disclosure provides a method of manufacturing a display panel. It should be noted that the display panel 100 as shown in FIG. 10 may be formed by the method of manufacturing the display panel. Specific processes of the method of manufacturing the display panel 100 are shown as follows:

101: providing a substrate 10.

In one embodiment, the substrate 10 may include a base plate 11 and a color film layer (RGB) 12.

In one embodiment, the base plate 11 may include glass, crystal, sapphire, or indium tin oxide. It should be noted that the base plate 11 may include, but is not limited to, the materials mentioned above, and may include other materials.

102: Depositing a transparent electrode layer 21 and a first metal layer 22 on the substrate 10, and etching the transparent electrode layer 21 and the first metal layer 22 to form a light-shielding layer 20 and an anode 23.

Figure 2:
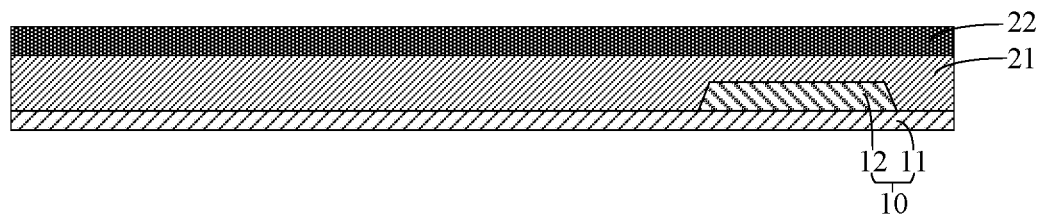
FIG. 2 is a first schematic view of an intermediate product manufactured in the process of the method of manufacturing the display panel according to the embodiment of the present disclosure.
Figure 3:
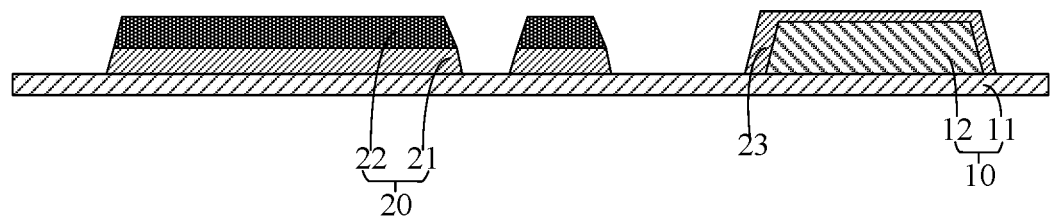
FIG. 3 is a second schematic view of the intermediate product manufactured in the process of the method of manufacturing the display panel according to the embodiment of the present disclosure.

Specifically, referring to FIG. 2 and FIG. 3, after depositing a transparent electrode layer 21 and a first metal layer 22 on the substrate 10, a photoresist may be sprayed on the first metal layer 22, and a preset pattern may be formed after exposing and developing the photoresist by using a photomask. Then, the photoresist formed with the preset pattern is used as a shielding layer to etch the transparent electrode layer 21 and the first metal layer 22 to form a first via hole 31 and a second via hole 32 exposing the base plate 11, and exposing the transparent electrode layer 21 disposed on the color film layer 12 to form the light-shielding layer 20 and the anode 23.

That is, the step of etching the transparent electrode layer 21 and the first metal layer 22 to form the light-shielding layer 20 and the anode 23 may include:

etching the transparent electrode layer 21 and the first metal layer 22 to form the first via hole 31 and the second via hole 32 exposing the base plate 11; and the transparent electrode layer 21 and the first metal layer 22 disposed between the first via hole 31 and the second via hole 32 are the light-shielding layer 20; and etching the first metal layer 22 to expose the transparent electrode 21 disposed on the color film layer 12. The transparent electrode 21 disposed on the color film layer 12 is the anode 23.

In one embodiment, materials of the transparent electrode 21 may be indium tin oxide (ITO) or transparent conductive oxide (TCO). Materials of the first metal layer 22 may be molybdenum (Mo), aluminum (Al), copper (Cu), or titanium (Ti), or may be an alloy manufactured by combinations thereof.

It should be noted that the terms "first", "second", and "third" described in the present disclosure are merely used to describe the object, and it should not be understood as indicating or implying relative importance or implicitly indicating the number of technical features indicated. Thus, the features defined as "first", "second", and "third" may explicitly or implicitly include one or more of the features.

103: forming a buffer layer 30, an oxide layer 40, and an insulating layer 50 on the light-shielding layer 20 in sequentially, and the buffer layer 30 and the insulating layer 50 are formed by the same photomask.

Figure 4:
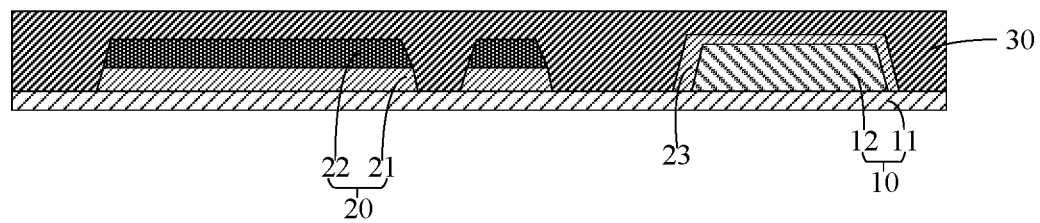
FIG. 4 is a third schematic view of the intermediate product manufactured in the process of the method of manufacturing the display panel according to the embodiment of the present disclosure.
Figure 5:
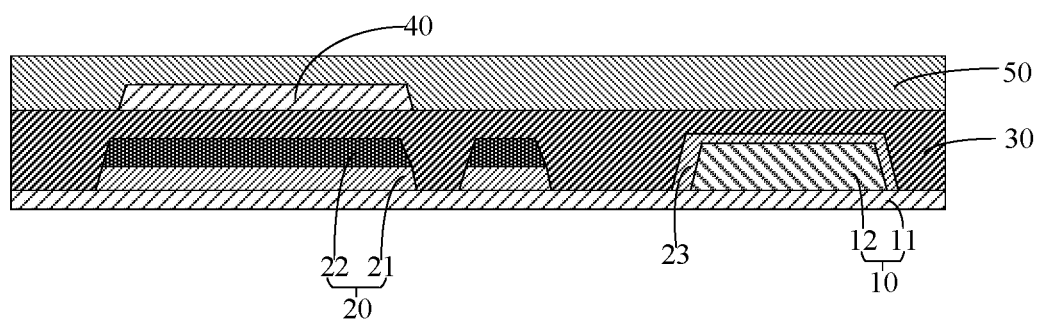
FIG. 5 is a fourth schematic view of the intermediate product manufactured in the process of the method of manufacturing the display panel according to the embodiment of the present disclosure.

Specifically, referring to FIG. 4 and FIG. 5, the oxide layer 40 may be composed of one or more materials of indium gallium zinc oxide (IGZO), indium zinc tin oxide (IZTO), and indium gallium zinc tin oxide (IGZTO). The insulating layer 50 may be comprised of aluminum oxide ($Al_2O_3$), hafnium dioxide ($HfO_2$), halo dioxide ($ZrO_2$), silicon oxide (SiOx), or silicon nitride (SiNx).

Specifically, the light-shielding layer 20 and the oxide layer 40 may be formed by exposing and developing through the same photomask.

Figure 6:
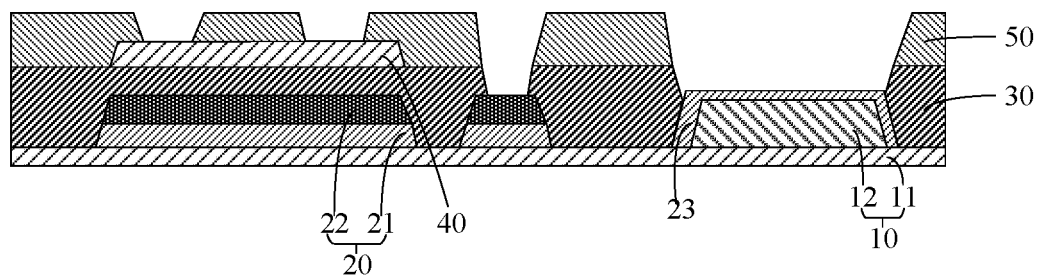
FIG. 6 is a fifth schematic view of the intermediate product manufactured in the process of the method of manufacturing the display panel according to the embodiment of the present disclosure.
Figure 7:
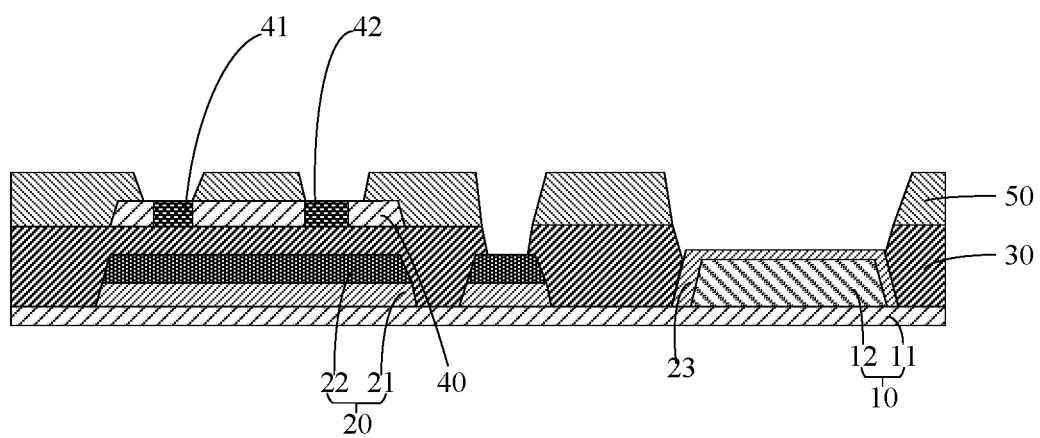
FIG. 7 is a sixth schematic view of the intermediate product manufactured in the process of the method of manufacturing the display panel according to the embodiment of the present disclosure.

Referring to FIG. 6 and FIG. 7, in some embodiment, after the step of forming the buffer layer 30, the oxide layer 40, and the insulating layer 50 on the light-shielding layer 20 in sequentially, the method may further include:

etching the insulating layer to expose a first portion 41 of the oxide layer 40 and a second portion 42 of the oxide layer 40; and conductorizing the first portion 41 and the second portion 42 to form an active layer 40.

Specifically, a photoresist may be sprayed on the insulating layer 50, and a preset pattern may be formed after exposing and developing the photoresist by using the photomask. Then, the photoresist formed with the preset pattern is used as a shielding layer to etch the insulating layer 50 exposing the first portion 41 and the second portion 42 of the oxide layer 40. Then, the first portion 41 and the second portion 42 are conductorized, allowing the oxide layer 40 to become the active layer 40.

In some embodiments, after step of forming the buffer layer 30, the oxide layer 40, and the insulating layer 50 on the light-shielding layer 20 in sequentially, the method may further include:

etching the insulating layer 50 and the buffer layer 30 to expose the anode 23.

Specifically, while performing the step of etching the insulating layer 50 exposing the first portion 41 and the second portion 42 of the oxide layer 40, the same photomask is used to etch the insulating layer 50 and the buffer layer 30 to expose the anode 23.

104: depositing the second metal layer 60 on the insulating layer 50, and etching the second metal layer 60 to form a source 61, a gate 62, and a drain 63.

Figure 8:
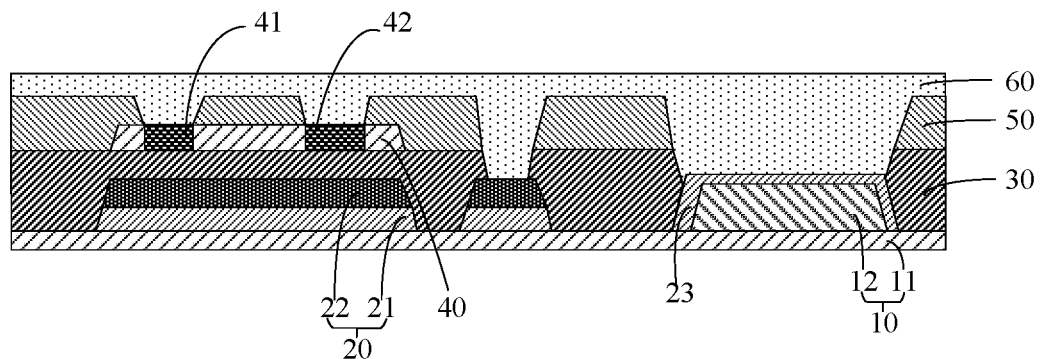
FIG. 8 is a seventh schematic view of the intermediate product manufactured in the process of the method of manufacturing the display panel according to the embodiment of the present disclosure.
Figure 9:
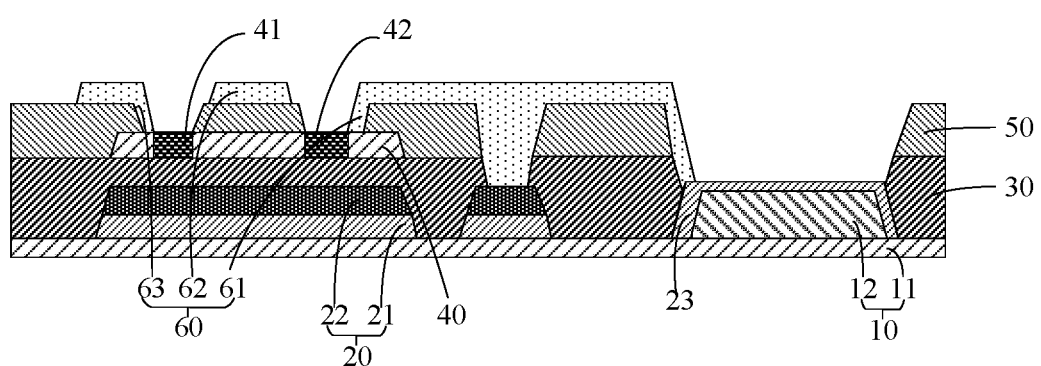
FIG. 9 is an eighth schematic view of the intermediate product manufactured in the process of the method of manufacturing the display panel according to the embodiment of the present disclosure.

Specifically, referring to FIG. 8 and FIG. 9, materials of the second metal layer 60 may be molybdenum (Mo), aluminum (Al), copper (Cu), or titanium (Ti), or may be an alloy manufactured by combinations thereof.

Specifically, a half-gray mask may be used in combination with a half-gray process and a reverse adhesive process. A predetermined pattern may be formed by sequentially exposing, dry-etching, physical vapor deposition (PVD), and stripping of the half-gray mask. Then, the half-gray scale mask is used as the shielding layer to etch the second metal layer 60 to form a third via hole 64 exposing the first portion 41 and a fourth via hole 65 exposing the second portion 42, so that the source 61, gate 62, and the drain 63 are patterned on the insulating layer 50.

That is, the step of etching the second metal layer 60 to form the source 61, gate 62, and the drain 63 may include:

etching the second metal layer 60 to form the third via hole 64 exposing the first portion 41 and the fourth via hole 65 exposing the second portion 42. The second metal layer 60 disposed between the third via hole 64 and the fourth via hole 65 is a gate 62, and the second metal layers 60 disposed on two lateral sides of the gate 62 are the source 61 and the drain 63.

It is understood that the source 61 and the drain 63 may be connected to the active layer 40 through the third via hole 64 and the fourth via hole 65.

In some embodiment, while preforming the step of etching the second metal layer 60 to form the source 61, gate 62, and the drain 63, the second metal layer 60 disposed on the anode 23 is etched to expose the anode 23.

105: forming a pixel defining layer 70, a light-emitting layer 80, and a cathode layer 90 on the second metal layer 60 in sequentially.

Specifically, the pixel defining layer 70 may be formed on the second metal layer 60, and the pixel defining layer 70 may be etched to expose the anode 23. The light-emitting layer 80 and the cathode layer 90 may be subsequently formed on the pixel defining layer 70, and the light-emitting layer 80 is connected to the anode 23.

It should be noted that the display panel 100 formed by the above embodiments may be applied not only to WOLED but also to IJP-OLED. It should be noted that, when the display panel 100 is applied to WOLED, the pixel defining layer 70 may be composed of a conventional non-hydrophobic material. When the display panel 100 is applied to IJP-OLED, the pixel defining layer 70 may be composed of a hydrophobic material.

Referring to FIG. 10, FIG. 10 is the display panel 100 according to one embodiment of the present disclosure. The display panel 100 may include: a substrate 10, and a transparent electrode 21, a first metal layer 22, a buffer layer 30, an oxide layer 40, an insulating layer 50, a second metal layer 60, a pixel defining layer 70, a light-emitting layer 80, and a cathode layer 90 subsequently disposed on the substrate 10.

In one embodiment, the substrate 10 may include a base plate 11 and a color film (RGB) 12.

In the present embodiment, the transparent electrode 21 and the first metal layer 22 may constitute a light-shielding layer 20; the transparent electrode 21 may constitute an anode 23; and the second metal layer 23 may constitute a source 61, a gate 62, and a drain 63.

Specifically, a first via hole 31 and a second via hole 32 are disposed on the first metal layer 22 for exposing the base plate 11. The first metal layer 22 and the transparent electrode layer 21 disposed between the first via hole 31 and the second via hole 32 are the light-shielding layer 20. The transparent electrode layer 21 disposed on the color film layer 12 is the anode 23.

A third via hole 64 and a fourth via hole 65 exposing the oxide layer 40 are disposed on the second metal layer 60. The second metal layer 60 disposed between the third via hole 64 and the fourth via hole 65 is a gate 62, and the second metal layers 60 disposed on two lateral sides of the gate 62 are the source 61 and the drain 63.

It should be noted that the display panel 100 provided in the embodiment has the same structure as the display panel 100 formed by the method of manufacturing the display panel described above. For details, reference may be made to the foregoing embodiment, and details are not described herein again.

Based on the above, a method of manufacturing a display panel provided by the present disclosure includes providing a substrate; depositing a transparent electrode layer and a first metal layer on the substrate, and etching the transparent electrode layer and the first metal layer to form a light-shielding layer and an anode; forming a buffer layer, an oxide layer, and an insulating layer on the light-shielding layer in sequentially, and the buffer layer and the insulating layer are formed by the same photomask; depositing a second metal layer on the insulating layer and etching the second metal layer to form a source, a gate, and a drain; and forming a pixel defining layer, a light-emitting layer, and a cathode layer on the second metal layer in sequentially. The present disclosure may save manufacturing process of the photomask, and further save the manufacturing time and manufacturing cost of the display panel 100.

In the above embodiments, the description of each embodiment has its own emphasis. For a part that is not described in detail in one embodiment, refer to the description of other embodiments.

In the above, the embodiments of the present disclosure provides a method of manufacturing a display panel and the display panel, and the present disclosure has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing a display panel, comprising following steps:
    providing a substrate;
    depositing a transparent electrode layer and a first metal layer on the substrate, and forming a light-shielding layer and an anode simultaneously by etching the transparent electrode layer and the first metal layer;
    forming a buffer layer, an oxide layer, and an insulating layer on the light-shielding layer in sequentially, wherein the buffer layer and the insulating layer are formed by a same photomask;
    depositing a second metal layer on the insulating layer and etching second metal layer to form a source, a gate, and a drain; and
    forming a pixel defining layer, a light-emitting layer, and a cathode layer on the second metal layer in sequentially.

2. The method of manufacturing the display panel according to claim 1, wherein the substrate comprises a base plate and a color film layer disposed on the base plate.

3. The method of manufacturing the display panel according to claim 2, wherein the step of etching the transparent electrode layer and the first metal layer to form the light-shielding layer and the anode comprises:
    etching the transparent electrode layer and the first metal layer to form a first via hole and a second via hole exposing the base plate, wherein the transparent electrode layer and the first metal layer disposed between the first via hole and the second via hole are the light-shielding layer, and
    etching the first metal layer to expose the transparent electrode layer disposed on the color film layer, wherein the transparent electrode layer disposed on the color film layer is the anode.

4. The method of manufacturing the display panel according to claim 1, wherein a step between the steps of forming the buffer layer, the oxide layer, and the insulating layer on the light-shielding layer in sequentially and depositing the second metal layer on the insulating layer further comprises:
    etching the insulating layer to expose a first portion of the oxide layer and a second portion of the oxide layer; and
    conductorizing the first portion and the second portion to form an active layer.

5. The method of manufacturing the display panel according to claim 4, wherein the step of etching the second metal layer, to form the source, the gate, and the drain comprises:
    etching the second metal layer to form a third via hole exposing the first portion and a fourth via hole exposing the second portion, wherein the second metal layer disposed between the third via hole and the fourth via hole is the gate, and the second metal layers disposed on two lateral sides of the gate are the source and the drain.

6. The method of manufacturing the display panel according to claim 4, further comprising etching the insulating layer and the buffer layer to expose the anode.

7. The method of manufacturing the display panel according to claim 6, wherein the step of forming the pixel defining layer, the light-emitting layer, and the cathode layer on the second metal layer in sequentially comprises:
    forming the pixel defining layer on the second metal layer, and etching the pixel defining layer to expose the anode; and
    forming the light-emitting layer and the cathode layer on the pixel defining layer in sequentially, wherein the light-emitting layer is connected to the anode.

8. The method of manufacturing the display panel according to claim 1, wherein a material of the pixel defining layer comprises a non-hydrophobic material.

9. The method of manufacturing the display panel according to claim 1, wherein a material of the pixel defining layer comprises a hydrophobic material.

* * * * *